US010276232B2

(12) United States Patent
Wu et al.

(10) Patent No.: US 10,276,232 B2
(45) Date of Patent: Apr. 30, 2019

(54) READ MARGIN TRACKING IN MEMORY APPLICATIONS

(71) Applicant: Taiwan Semiconductor Manufacturing Company Limited, Hsinchu (TW)

(72) Inventors: Fu-An Wu, Hsinchu (TW); Cheng Hung Lee, Hsinchu (TW); Chen-Lin Yang, Hsinchu County (TW); Hao-I Yang, Taipei (TW); Tsung-Hsien Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/860,782

(22) Filed: Jan. 3, 2018

(65) Prior Publication Data
US 2018/0342291 A1 Nov. 29, 2018

Related U.S. Application Data

(60) Provisional application No. 62/510,806, filed on May 25, 2017.

(51) Int. Cl.
| | | |
|---|---|---|
| *G11C 11/00* | (2006.01) | |
| *G11C 11/419* | (2006.01) | |
| *G11C 11/418* | (2006.01) | |
| *G11C 7/08* | (2006.01) | |
| *G11C 5/14* | (2006.01) | |

(52) U.S. Cl.
CPC .............. *G11C 11/419* (2013.01); *G11C 7/08* (2013.01); *G11C 11/418* (2013.01); *G11C 5/14* (2013.01)

(58) Field of Classification Search
CPC ......... G11C 7/08; G11C 11/419; G11C 7/227; G11C 7/12; G11C 7/065; G11C 11/4076; G11C 11/4091; G11C 11/4094; G11C 7/06; G11C 7/1021; G11C 7/1051; G11C 7/106; G11C 7/22; G11C 8/18
USPC .......... 365/194, 203, 154, 191, 156, 189.05, 365/196, 204, 205, 207, 208, 210.1, 365/233.5, 238.5
See application file for complete search history.

(56) References Cited

U.S. PATENT DOCUMENTS

2015/0092502 A1* 4/2015 Yang .................... G11C 11/419
365/191

\* cited by examiner

*Primary Examiner* — Thong Q Le
(74) *Attorney, Agent, or Firm* — Jones Day

(57) ABSTRACT

A sense amplify enable (SAE) signal is generated on a SAE line by receiving a trigger signal at a first circuit portion coupled to a first domain power supply and a second circuit portion coupled to a second domain power supply. The second domain power supply is separate and distinct from the first domain power supply. The first circuit portion and the second circuit portion are each further coupled to the SAE line for carrying the SAE signal. For a first period of time, a first portion of the SAE signal is generated based on the first domain power supply using the first circuit portion. And, for second period of time, a second portion of the SAE signal is generated based on the second domain power supply using a second circuit portion.

20 Claims, 8 Drawing Sheets

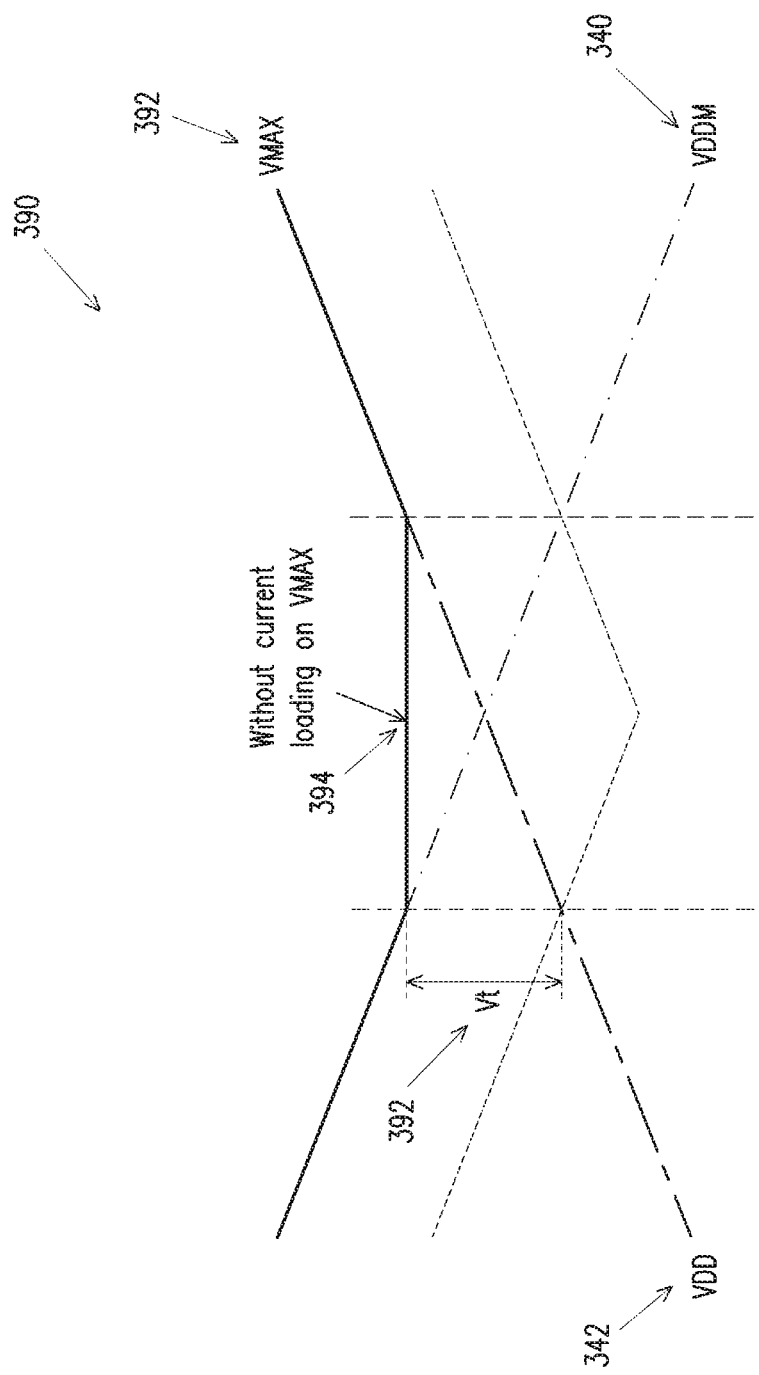

ular sense amplifier driver circuit in accordance with one or more embodiments.
READ MARGIN TRACKING IN MEMORY APPLICATIONS

PRIORITY CLAIM

The present application claims priority to U.S. Application No. 62/510,806, filed May 25, 2017, which is incorporated by reference herein in its entirety.

BACKGROUND

In memory applications, a sense amplifier is connected to a memory cell array in order to read data contained in a memory cell array during a read or refresh operation. With the scale of integrated circuits decreasing, the operation voltages of integrated circuits are reduced and similarly the operation voltages of memory circuits are reduced.

DESCRIPTION OF THE DRAWINGS

One or more embodiments are illustrated by way of example, and not by limitation, in the figures of the accompanying drawings, wherein elements having the same reference numeral designations represent like elements throughout.

FIG. 3b is a chart illustrating the output of a voltage maximum circuit in accordance with one or more embodiments.

DETAILED DESCRIPTION

Figure 1A:
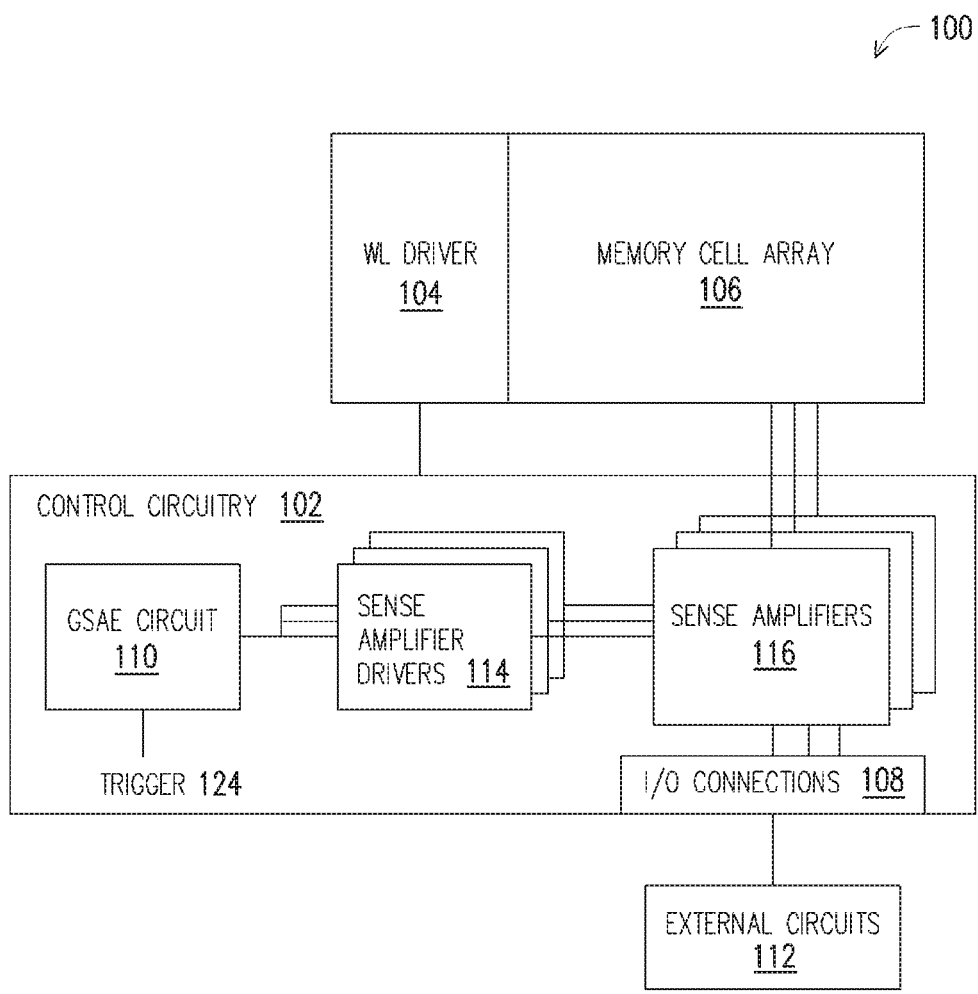
FIG. 1a is a block diagram of a memory circuit in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In memory applications an integrated circuit and an associated memory circuit may have independent electric supplies, providing independent operational voltages. In line with industry trends, the scale of integrated circuits grows increasingly smaller resulting in a similar reduction of operation voltages in both integrated circuits and their associated memory circuits. As the operational voltages of integrated circuits and an associated memory circuit are reduced, the read and write margins of the memory circuit memory cells and peripheral circuit signals are also reduced. These read margins are a measure of how reliable the data bits of a memory cell can be read from and/or written into. To counteract the effects of reduced read margins, sense amplifiers are employed to amplify the signal on each cell column within a memory circuit.

An array dual rail (ADR) memory application has two power supply rails, one power supply rail is for the memory cell array and the other is for the peripheral circuitry. A word-line is used in addressing a row of memory cells within memory cell array. Each memory cell within the array is also selectably coupled to a bit-line (and its complement, e.g. bit-line bar in SRAM applications) which is used for storing a data bit into a selected memory cell, or for reading a data bit from selected cells.

In embodiments, a memory system for reading and writing data stored in one or more individual cell columns, or bit-lines, of a memory cell array by asserting a particular word-line signal includes means of asserting and supplying signals that originate in different power domains. The control circuit for controlling the word-line is in a first power domain (e.g. $V_{dd}$) corresponding to the peripheral circuitry, or the overall integrated circuit. The word-line itself may be supplied by a second power domain (e.g. $V_{ddm}$), that may also supply the memory cell array, or memory circuit. When a word-line activates a row of bits within the memory array, each bit is placed on a corresponding bit-line. This bit-line is then read out by the I/O circuitry that may be in the first power domain.

Supply voltage fluctuations in, e.g., $V_{dd}$ and $V_{ddm}$, may affect the read margins at the I/O. To compensate for these fluctuations sense amplifiers are employed at the I/O of the memory cell array to improve voltage change sensing. In embodiments each bit-line is associated with an individual sense amplifier. When a word-line is activated, the control circuit includes timing circuitry for enabling the sense amplifiers at the appropriate time to coincide with, e.g., a read operation. Each sense amplifier is enabled by an individual local sense amplify enable signal. Each local sense amplify enable signal is generated responsive to a global sense amplifier enable (GSAE) signal that may be generated by the control circuitry. This GSAE signal may be generated in response to a bit-line read enable signal generated by the memory application's control circuitry.

Routing delays arise in memory applications as supply voltages fluctuate. Lower voltages and thus smaller currents result in longer rise times in circuit routes. When two components receive the same supply voltages they experience similar routing delays. But, in ADR memory applications, which include various components in two different power domains, the independent power domains may give rise to independently fluctuating voltages and as a result independent routing delays. This is true for any memory applications in which the memory cell array and the peripheral circuits have different power supplies. Thus, for example, when a word-line is driven by a voltage (e.g., $V_{ddm}$) that is lower than the voltage driving corresponding sense amplifiers (e.g., $V_{dd}$), the data contained in the corresponding memory array row may not be ready on the cell columns when the sense amplifiers are initially enabled. This is because the rise time on the word-line is slower than the rise time of the GSAE and other control circuitry. This gives rise to a delay between when a clock rises and when data is valid on the I/O line. In order to ensure optimize read margins, the GSAE signal has tight timing tracking with the word-line.

This delay is dominated by the rise time on GSAE, the rise time on an asserted word-line, and the rise time on a particular bit-line (and its complement in SRAM applications). Because routing delays may differ, this may affect circuit timing, and so memory applications are designed to account for and assume the worst case scenarios giving rise to the lengthiest delays. Thus it is useful to improve the worst case scenario. The worst case scenario in SRAM applications, for example, occurs at the minimum voltage difference between a bit-line and its complement (BL and BLB or DL and DLB) under all Vdd/Vddm supporting ranges accounting for temperature and process variations.

A global sense amplify enable signal is generated by the peripheral circuitry at the appropriate time to enable all the sense amplifiers in a memory application. When a control circuit activates a word-line for reading it may issue a bit-line read enable signal, or a similar signal that may operate as a trigger signal for the GSAE signal generation circuit.

FIG. 1a depicts a block diagram of a memory circuit 100 in accordance with one or more embodiments. In embodiments, a memory circuit comprises control circuitry 102, a word-line driver 104 and a memory cell array 106. The memory cell array 106 stores data in individual memory cells; each cell capable of storing one bit. The memory cell array 106 cells are addressable by their respective intersection with an individually selectable word-line, or row line, corresponding to a row of data bits, which may be of any suitable length, and an individual column, or bit-line. A word-line is selected and driven by a word-line driver 104. The word-line driver 104 receives control signals from the control circuitry 104, and in response selects and causes an individually addressed word-line to be asserted. Responsive to an asserted word-line, data stored within memory cells within the memory cell array 106 that are associated with an asserted word-line are gated onto their respective bit-lines. The control circuit 102 may also include a column selector, for selecting individual bit-lines or ranges of bit-lines to be delivered to the IO circuitry 108.

Figure 1B:
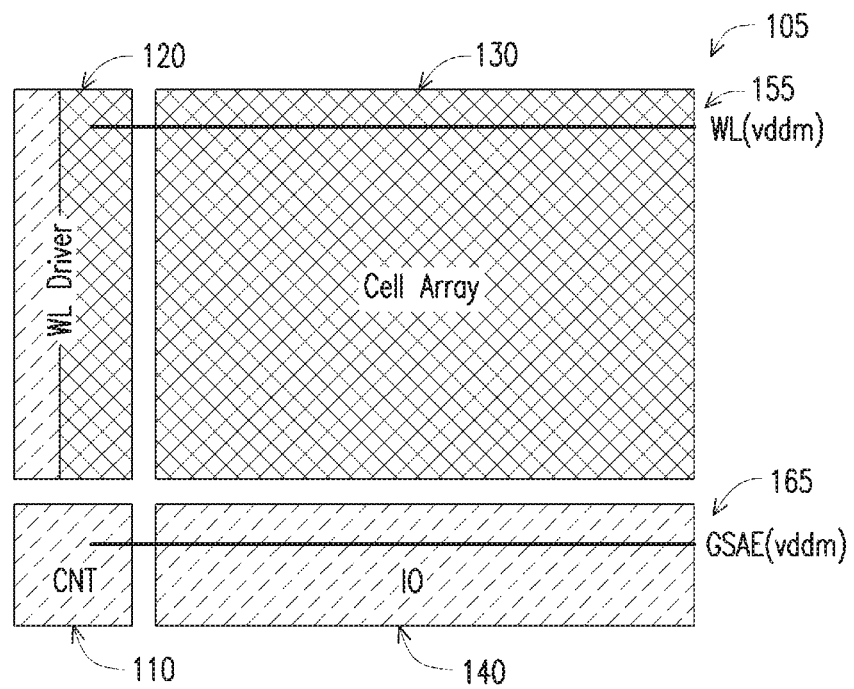
FIG. 1b is a chart illustrating power domains in accordance with one or more embodiments.

The control circuitry 102, GSAE 110 and the word-line driver 104, 120 may be supplied by $V_{dd}$ 242 while the word-line 155 and the memory cell array 106, 130 may be supplied by $V_{ddm}$ as illustrated in FIG. 1b, which is a chart 105 illustrating the power domain from which each respective component 110, 120, 130, 140, 155, 165 receives its supply. As illustrated WL Driver 120 may include control components also powered by $V_{dd}$ 242 while the word-line 155 itself may be supplied by the $V_{ddm}$ domain 240. When the control circuits cause, e.g., a read operation, a GSAE signal 165 is generated by the GSAE circuit 110 in part by drawing on a supply voltage from the cell array supply, that is $V_{ddm}$ domain 240. This GSAE signal 165 is propagated to each of the sense amplifier drivers 114, which in turn generate a sense amplify signal to enable the sense amplifiers 116 which boost each bit-line for read out by the circuit's IO 108, 140. These sense amplifiers each receive a bit-line, and amplify that bit-line in order to read out the data bit of each bit-line to the circuits I/O connections 108 where the data is read by external circuits 112. In propagating GSAE to each local sense amplify enable driver circuit 114, GSAE may be buffered to avoid clock skew by lengthy propagation to more distant sense amplifiers in the circuit. This also reduces any fan-out issues caused by propagating the GSAE to many drivers.

In embodiments, generally, the memory array 130 supply voltage is higher than the voltage supplied to peripheral control circuitry 110, 120, 140, e.g. generally Vddm 240>Vdd 242. This is desirable because a higher $V_{ddm}$ results in better reliability of data stored in the memory cell array, while $V_{dd}$ is lower to reduce power consumption over all in the control circuitry. As mentioned above, in known systems a word-line and GSAE are supplied by different power domains and performance is degraded in response to independent voltage variations in each domain. This is because, large read margin variations occur across power domains, e.g. across $V_{dd}$ and $V_{ddm}$, and voltage variations may cause the peripheral supply voltage to exceed the memory array supply. When Vdd is greater than Vddm, and GSAE is supplied entirely by Vdd, GSAE rise time is much faster than the word-line and bit-line rise times. Tcd is then dominated by the read margin worst case scenario occurring at $V_{dd}$>$V_{ddm}$, and read margins are not optimized at low $V_{dd}$. But, by generating a first portion of the GSAE signal by taking power supply from the same domain as the word-line, the GSAE signal rise times will track the rise times of the word-line signal thereby optimizing read margin. And, by generating a second portion of the GSAE signal in accordance with this disclosure by taking power supply from the control circuit domain, Vdd, the worst case scenario as a result of power fluctuations across domains shifts from $V_{dd}$>$V_{ddm}$ to $V_{dd}$=$V_{ddm}$, because in embodiments the GSAE signal is Vdd when $V_{ddm}$<$V_{dd}$.

Figure 1C:
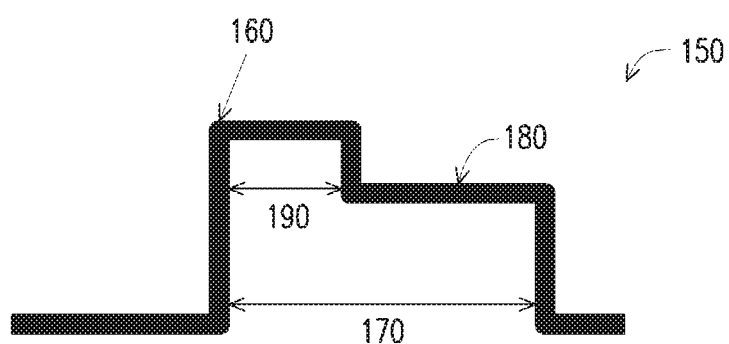
FIG. 1c is a graph of an exemplary sense amplify enable signal waveform in accordance with one or more embodiments.

FIG. 1c illustrates a GSAE signal 150 in accordance with disclosed embodiments that mitigates the effects of voltage fluctuations in different power domains, and shifts the worst case scenario, and the read-margin cut off, to $V_{ddm}$=$V_{dd}$ (instead of $V_{ddm}$<$V_{dd}$). This signal 150 is generated by drawing on supply from two power domain supplies. At the front edge 160, the GSAE signal 150 is driven by a first supply domain, and then after a delay 190, a trailing portion 180 draws supply from a second supply domain for the remainder of the signal period 170. In embodiments the front edge 160 of the GSAE signal 150 draws power from the memory array power supply, e.g. the front edge takes $V_{ddm}$. The trailing portion 180 then takes $V_{dd}$. In other embodiments the ordering can be reversed as desired. Because $V_{ddm}$ is greater than $V_{dd}$, generating a GSAE signal 150 using the $V_{ddm}$ power domain 160 improves the GSAE read margin, because the higher voltage of $V_{ddm}$ drives a stronger current thereby reducing the rise time of the GSAE signal. And, because this front edge of GSAE is driven by the same supply domain as the WL, the two signals have good timing tracking, thereby optimizing the read margin. In embodiments, GSAE signal 150 may be utilized as a local sense enable amplify signal, or alternatively GSAE signal 150 may be used to trigger local sense enable amplify signals.

Figure 2:
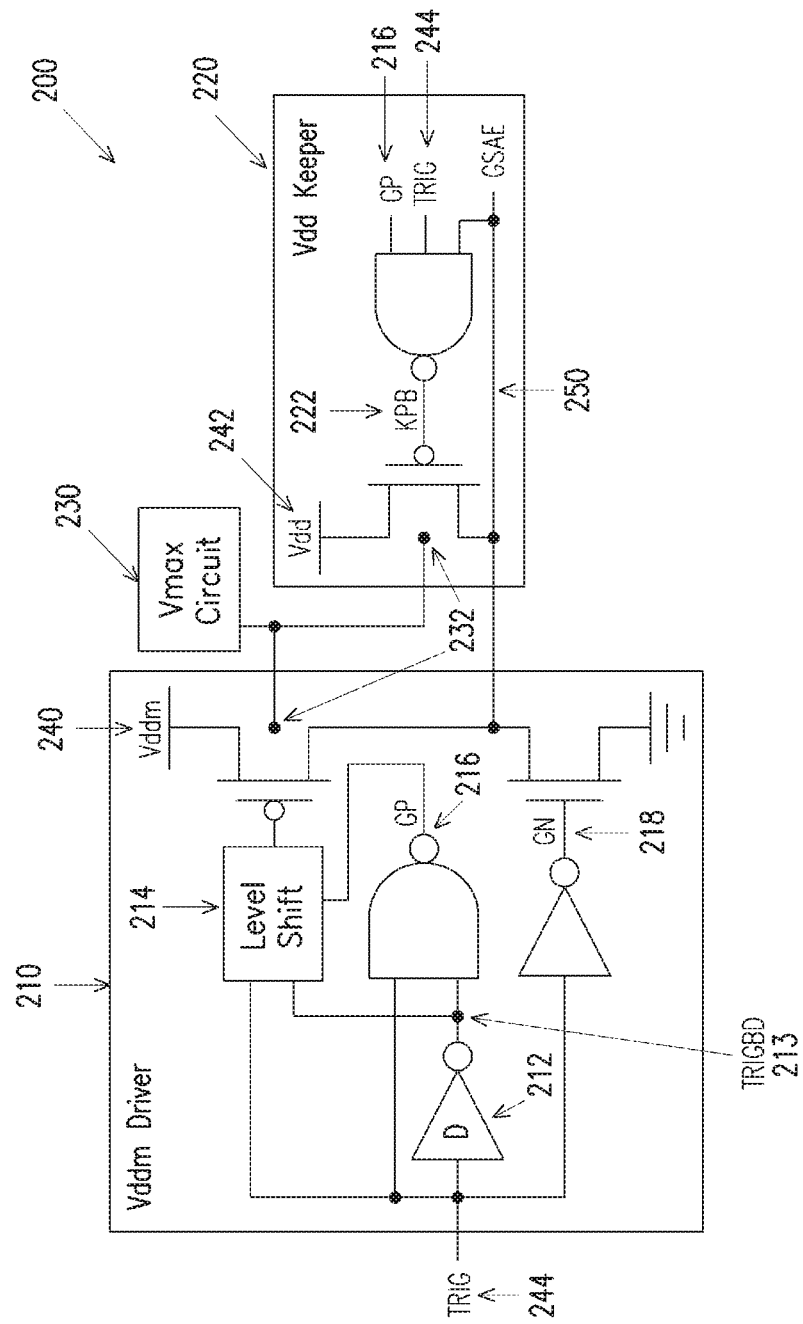
FIG. 2 is a schematic diagram of a sense amplifier driver circuit in accordance with one or more embodiments.

FIG. 2 illustrates a block diagram of a circuit 200 for generating a GSAE signal, e.g. GSAE signal 150, on a GSAE line 250 in accordance with the present embodiment. In order to control a signal supplied by one power supply domain, e.g. Vddm 240, using control signals originating in a second power supply domain, e.g. Vdd 242, a level shifter circuit may be employed. A level shifter, or logic level shifter, is circuit that translates signals from one logic level to another, or from one voltage domain to another, thereby allowing compatibility between integrated circuit components that have different voltage requirements (for example, where a trigger signal 124, sense amplifiers 116, sense amplifier drivesr 114, and the I/O circuits 108 are in one power domain, e.g. Vdd 242 or 242, while components supply driving front edge 180 of GSAE 150 take power from another power domain, e.g. Vddm 240. Thus, a level shifter 214 may be employed in order to generate a portion of the GSAE line 250 signal, for example front edge 180 of GSAE 150. As discussed above, relying purely on Vddm 240 to drive the GSAE signal however suffers from read margin degradation when voltage fluctuations cause a condition where $V_{dd}>V_{ddm}$. When $V_{dd}>V_{ddm}$, the voltage of the GSAE 250 signal based on Vddm will not develop fast enough to ensure the sense amplifiers are enabled at the correct time. So, as discussed above, a portion 180 of the signal 150 is also generated from the $V_{dd}$ 242 power domain in order to guarantee a reliable worst case scenario $V_{ddm}=V_{dd}$.

GSAE generation circuit 200 includes three sub-circuits: $V_{ddm}$ Driver circuit 210, $V_{dd}$ Keeper circuit 220, and $V_{max}$ circuit 230. These three circuits 210, 220, and 230 draw supply voltages from two separate and distinct power domains $V_{ddm}$ 240 and $V_{dd}$ 242, responsive to a trigger signal 244 generated by the memory application control circuitry 102. This trigger signal 244 may be a bit-line read enable signal or some other trigger signal 124 generated by the memory application control circuitry 102. These three circuits 210, 220, and 230 cooperate to generate a waveform substantially in the form of GSAE signal 150 on GSAE line 250. Circuit 200 may be employed in a memory application such as memory application circuit 100, where it may be utilized as GSAE circuit 110.

$V_{ddm}$ driver circuit 210 receives a trigger signal, TRIG, 244. Trigger signal 244 may be generated external to the memory array and related control circuitry to a memory array when reading data from a memory array or when writing data to a memory array. For example, trigger signal 244 may be generated by an external computer processing circuit that requests a memory read operation or a memory write operation. Trigger signal 244 is distributed through the $V_{ddm}$ driver circuit 210 to a level shift circuit 214 a delay gate 212 that provides a complement to TRIG 244, TRIGBD 213, and to a NOT gate having an output node where a gate NMOS signal GN 212 serves to gate an NMOS transistor. Signal GN 218 gates an NMOS that when ON serves to pull the GSAE line 250 low. Thus, so long as TRIG 244 is low (indicating no read or write requiring activation of the sense amplifiers), GN 218 remains high, and GSAE 250 is pulled low. TRIG 244 and TRIGBD 213 serve as inputs to a two port NAND gate to generate gate PMOS (or pull-up gate) signal GP 216. All of the values TRIG 244, TRIGBD 213, GP 216, and GN 218 are in the $V_{dd}$ domain 242. TRIG 244, TRIGBD 213, and GP 216 serve as inputs to the level shifter circuit 214. Level shifter 214 translates logic levels between components taking power from power domains $V_{dd}$ 242 and the $V_{ddm}$ 240 domain, thereby allowing control signals 244, 213, 216 in Vdd domain 242 to gate a Vddm 242 voltage onto GSAE 250 using one or more transistors taking power from Vddm 242.

$V_{dd}$ keeper circuit 220 operates to gate $V_{dd}$ onto the GSAE line 250 after GSAE initially goes high in response to the cooperation of $V_{ddm}$ driver circuit 210 and $V_{max}$ circuit 230. For example, assuming, $V_{ddm}>V_{dd}$, level shift circuit 214 gates Vddm 240 onto the GSAE line 250. Then after a delay, e.g. introduced by delay gate 212, Vdd keeper 220 gates Vdd onto GSAE 250. If however $V_{dd}>V_{ddm}$, the Vmax circuit pulls the $V_{ddm}$ driver up to $V_{dd}$, causing $V_{dd}$ to appear on GSAE during the delay period, so that when $V_{dd}>V_{ddm}$, $V_{dd}$ 242 appears on GSAE 250 for the duration of a GSAE signal period. This ensures that the worst case scenario, described above, results in a read margin that is the same as when $V_{dd}=V_{ddm}$ for all $V_{ddm}<V_{dd}$ (i.e. the read margin does further degenerate as $V_{ddm}$ becomes smaller than $V_{dd}$. Vdd Keeper circuit 220 also receives TRIG signal 244 and GP signal 216. These signals 244, 216 and GSAE 250 serve as inputs to a three port NAND gate to generate a keeper bar signal KPB 222. So long as KPB 222 is held low, $V_{dd}$ keeper 220 pulls up GSAE 250 to the $V_{dd}$ domain 242. KPB 222 is only low (enabling the pull-up transistor) as long as GP 216, TRIG 244 and GSAE 250 are high. Thus, KPB 222 is always high (and thus $V_{dd}$ cut off from GSAE 250 by a PMOS transistor) as long as TRIG 244 is low, e.g. when no sense amplifier activity is desired. When TRIG 244 is asserted, TRIGBD 213 remains high for a period as a result of the delay introduced by the delay gate 212, and GSAE 250 is pulled up to $V_{ddm}$ 240, creating the front edge 160 of the GSAE signal 250. Because GP=TRIG(NAND)TRIGBD, GP 213 is low when TRIG goes high, and for a period introduced by the delay gate 212, TRIGBD 213 remains high. After the delay period introduced by delay gate 212, TRIGBD 213 goes low causing GP 216 to return to a high state.

Thus, after TRIG 244 is asserted high, GP 216 initially goes low and then returns high after a delay, by which time GSAE 250 is pulled up to $V_{ddm}$, and is also a logical high. Once GP 216 returns to a high state, so long as TRIG 240 remains asserted, GSAE also remains a logical high by gating $V_{dd}$ to GSAE 250 when $V_{ddm}$ is cut off from GSAE 250. KPB remains low then so long as TRIG 244 remains asserted, thereby generating the trailing portion 180 of GSAE signal 250. And when TRIG 244 is de-asserted (goes low), GN 218 returns high thereby pulling GSAE low, and KPB 222 goes high cutting off $V_{dd}$ 242 power form GSAE 250. In this way, the total period 170 of the GSAE signal 250 is substantially the same as a period during which TRIG 244 is asserted, and is comprised of a front edge period 190 during which GP 216 is asserted, and a trailing edge period during which KPB 222 is asserted.

Because power fluctuations may occur for various reasons that may alter the standard relationship of $V_{ddm}$ 240>$V_{dd}$ 242, a $V_{max}$ circuit 230 is coupled to the pull-up substrate 232 of the PMOS pull-up transistors in both $V_{ddm}$ and $V_{dd}$. The $V_{max}$ circuit ensures that GSAE 250 tracks the larger of $V_{ddm}$ and $V_{dd}$ when GSAE is not pulled low by GN 218, i.e. during the period in which TRIG 244 is asserted, ignoring inherent gate delays as explained further below (see FIG. 4).

Figure 3A:
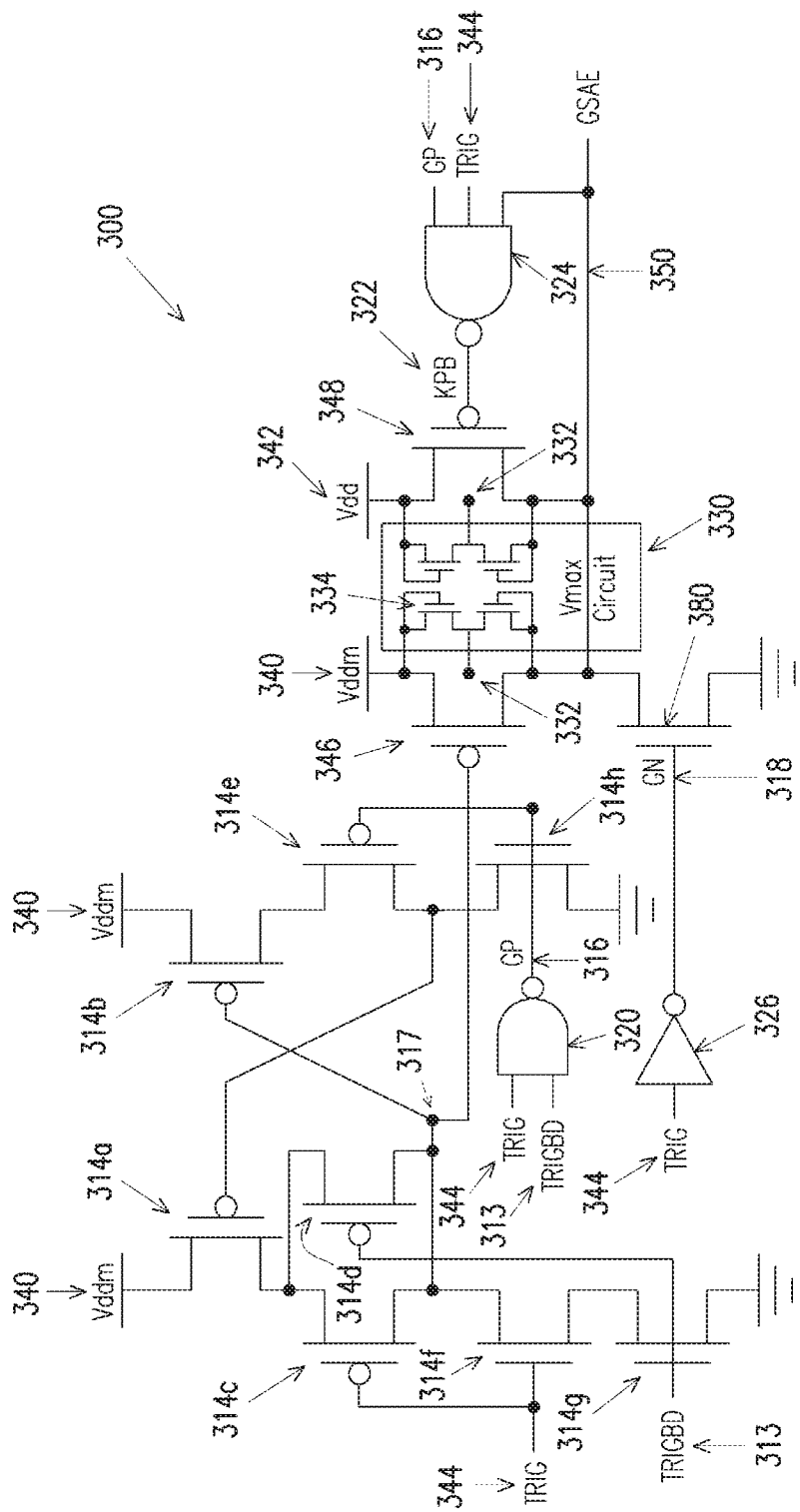
FIG. 3a is a schematic diagram of a sense amplifier driver circuit in accordance with one or more embodiments.

FIG. 3a depicts a schematic for a circuit capable of generating a GSAE signal in substantially the form of signal 150, and including a leading edge 160 generated in a first domain and a trailing edge 180 generated in a second domain. The first domain 340 may be $V_{ddm}$ and the second domain 342 may be $V_{dd}$. GSAE generation circuit 300 includes components that independently draw supply voltages from two separate and distinct power domains $V_{ddm}$ 340 and $V_{dd}$ 342, responsive to a trigger signal 344 generated by the memory application control circuitry 102. This trigger signal 344 may be a bit-line read enable signal, or some other trigger signal, 124 generated by the memory application control circuitry 102. This circuit operates to generate a waveform substantially in the form of GSAE signal 150 on GSAE line 350 as the output $V_{MAX}$ of the $V_{MAX}$ Circuit 330 portion of circuit 300. Circuit 300 may be employed in a memory application such as memory application circuit 100, where it may be utilized as GSAE circuit 110. Circuit 300 may describe various embodiments of GSAE generation circuit 200. The actual values for Vddm 340 and Vdd 342 appearing on GSAE 350 may vary slightly under normal conditions with respect to an ideal voltage, for example such that Vddm 340 is +/−%5 of an ideal Vddm value and Vdd 342 is +/− an ideal Vdd value. Vdd 342 and Vddm 340 as appearing on GSAE 350 will vary according to a particular invention and design tolerances, and in some cases may vary by more than +/−5%, for example by design or in the presence of voltage fluctuations or transients that may cause larger range of variances including causing Vdd>Vddm regardless of the target ideal voltages.

Figure 4:
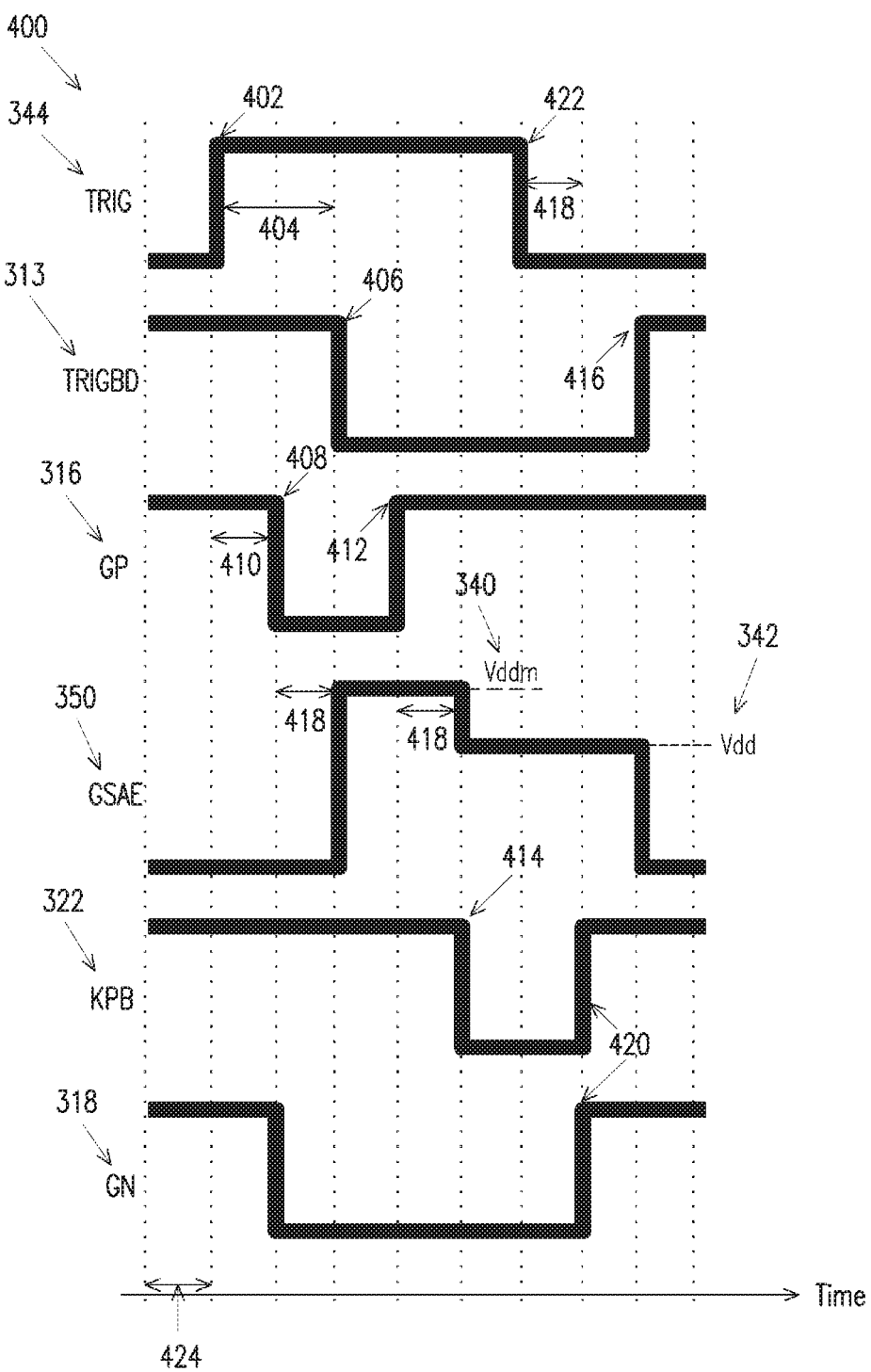
FIG. 4 is a graph of exemplary waveforms during operation in accordance with one or more embodiments.

The following explanation is made with reference to both FIG. 3b and FIG. 4, which illustrates a timing diagram showing the states of TRIG 344, TRIGBD 313, GP 316, GSAE 350, KPB 322, GN 318 over the course of time during which TRIG 344 is asserted, for example by memory control circuitry 102. GSAE generation circuit 300 receives a trigger signal, TRIG 344, and a delayed complement of TRIG 344, TRIGBD 313. Signal GN 318 is also a complement to TRIG 344 as being generated by NOT gate 326 with TRIG 344 as input, thus GN is a complement of TRIG 344 without an introduced delay; however it does experience inherent gate delay 410 in logic NOT gate 326 (illustrated as the delay between when TRIG 344 goes high at 402 and when GN 318 goes low). It will be appreciated that inherent gate delay is the latency between when a signal appears at the input to a gate and when the result of the logic operation appears at the output, and is typically one clock cycle 424. When TRIG 344 is asserted at 402, TRIGBD 313 remains high for delay period 404, at which point 406, TRIGBD takes the complement of TRIG 344 and goes low. Trigger signal 344 and delayed trigger bar 313 may each be generated by peripheral circuitry to a memory array when reading data from a memory array or when writing data to a memory array. Trigger signal 344 and delayed trigger bar 313 are distributed throughout circuit 300 to generate various other signals, and thereby cause generation of a waveform in substantially the same form as signal 150.

TRIG 344 and TRIGBD 313 are supplied to a set of PMOS 314a, 314b, 314c, 314d, 314e and NMOS 314f, 314g, 314h. When TRIG 344 is initially asserted at 402, TRIGBD 313 is initially high, thus both 314f and 314g are on, pulling node 317 low during the delay period 404 (before TRIGBD 316 takes TRIG 344 complement) thereby pulling up GSAE to $V_{ddm}$. Then after the delay 404, when TRIGBD 313 takes TRIG 344 complement at 406, 314g is turned off and 314d is turned on. Because pull-down transistor 314h is on before TRIG 344 is asserted at 402, 314a is in an on state when 314d is turned on at 406.

TRIG 344 and TRIGBD 313 are inputs to a NAND gate 320 having an output GP 316 which remains high so long as at least one of TRIG 344 and TRIGBD 313 are low. As delayed complements of each other, TRIG 344 and TRIGBD 313 will only both go high during a delay period. During the period of delay 404, while both TRIG 344 and TRIGBD 313 are high, GP 316 then takes a low state at 408 after some inherent gate delay 410, turning off pull-down transistor 314h, and turning on pull-up transistor 314e. Because node 317 is low at 408, PMOS 314b is on when 314e is turned on. Thus, when 314d is turned on, node 317 goes high, thereby cutting off the pull-up PMOS that pulls GSAE up to $V_{ddm}$ 340 in response to GP 316 going low at 408 after inherent gate delay 410. GP subsequently goes high at 412 in response to TRIGBD 313 going low at 406, which turns on pull down transistor 314h, turning on 314a. After TRIG 344 again goes low, plus gate delay 418, at 420 GN 318 goes high and turns on the NMOS pull-down transistor 380, thereby pulling GSAE 350 low. TRIGBD then goes high again at 416 turning on 314g which turns on 314d. Because 314a was turned on by GP 316 going high at 412, 317 takes $V_{ddm}$ 340, thereby holding pull up PMOS 346 in an off state until TRIG 344 is asserted again to generate another GSAE waveform. In this way, transistors 314a-f operate as a level shifter, taking input signals TRIG 344, TRIGBD 313, GP 316 from the $V_{dd}$ power domain as inputs to gates which operate to either assert or de-assert a $V_{ddm}$ supplied signal at node 317 as the gate to the PMOS transistor 346 acting as a pull-up transistor for the GSAE line.

Similarly, KPB signal 322 is the result of a three port NAND gate 324 comprising $V_{dd}$ input signals GP 316 and TRIG 344, and the GSAE signal 350. Before GN 318 asserts high at 420, GP 316 returns to a high state at 412. After GP 316 returns to a high state at 412, and after inherent gate delay KPB 322 asserts low at 414 (TRIG 344 remaining high and GSAE 350 being pulled up to $V_{ddm}$), turning on the $V_{dd}$ 346 pull-up transistor 348. Thus, under normal operating conditions, during the period when TRIG 344 is asserted high, 402 to 422, but before GP 316 is re-asserted high at 412, between 408 and 412 (plus inherent gate delay 418) GSAE 350 is pulled up through PMOS pull-up transistor 348 to $V_{ddm}$ 340 thereby generating the leading edge 160 of the GSAE signal 150. Then, during the period where both TRIG 344 and GP 316 are asserted high, 412 to 422, GSAE 350 is pulled up to $V_{dd}$ thereby creating the trailing portion 180 of the GSAE signal 150. Then when TRIG 344 is de-asserted at 422, GN returns high at 420 (after inherent gate delay 418) and pulls GSAE signal low and KPB return high cutting off pull up transistor 348. In this way, the total period 170 of the GSAE signal 350 is substantially the same as a period during which TRIG 344 is asserted, and is comprised of a front edge period 190 during which GP 316 is asserted, and a trailing edge period during which KPB 322 is asserted (in each case including some gate delays).

To account for power fluctuations, inputs to a GSAE line 350 are coupled to $V_{MAX}$ circuit 330, which includes four diode connected NMOS transistors 334. Two diode connected NMOS transistors 334 are coupled between $V_{ddm}$ 340 and GSAE 350 and share a source connection with a substrate 332 common to both PMOS transistors 346 and 348. The remaining two diode connected NMOS transistor 334 are coupled between Vdd 342 and GSAE 350 and share a source connection with substrate 332. The output of the VMAX circuit 392, as it appears on the GSAE line, over a range of voltages for $V_{ddm}$ 340 and $V_{dd}$ 342, is shown in the chart illustrated in FIG. 3B. In the region where $V_{ddm}$ 340 is greater than $V_{dd}$ 342+$V_t$ 392, $V_{MAX}$ 392 takes $V_{ddm}$ 340. In the region where $V_{dd}$ 342 is greater than $V_{ddm}$ 340+$V_t$ 392, $V_{MAX}$ 392 takes $V_{dd}$. In each case $V_t$ 392 is the MOS threshold voltage, e.g. of transistors 346, 348. It will be understood that $V_t$ is the threshold, or turn on, voltage of a transistor, which is the minimum gate-to-source voltage ($V_{gs}$) differential required to establish a conductive channel, i.e. to allow a transistor to conduct a current between its drain and source terminals. In a p-type device $V_{gs}$ is negative to form a channel, and so current will only flow when $V_{gs}$ falls below negative $V_t$. Conversely, in an n-type device the gate to source voltage is positive to induce a channel, so $V_{gs}$ must exceed positive $V_t$. $V_t$ varies in embodiments according to the fabrication process specifications, i.e., channel length, channel width, doping, etc. In the region where $|V_{ddm}-V_{dd}|<V_t$, $V_{MAX}$ 392 is held at a constant value 394 without any current loading on $V_{MAX}$. In embodiments, the VMAX circuit 392 comprises ultra-low threshold components having $V_t^{ULT} \ll V_t^{INT}$ where $V_t^{INT}$ is the intrinsic threshold (corresponding to an intrinsic dopant concentration of a semiconductor). Thus, the VMAX components are preferably selected such that the magnitude of $V_t^{ULT}$ is substantially less than the magnitude of the threshold voltage of transistors 346 or 348. The various embodiments described by FIGS. 2 and 3 are two examples of various means for generating a GSAE signal in accordance with the present disclosure.

Figure 5:
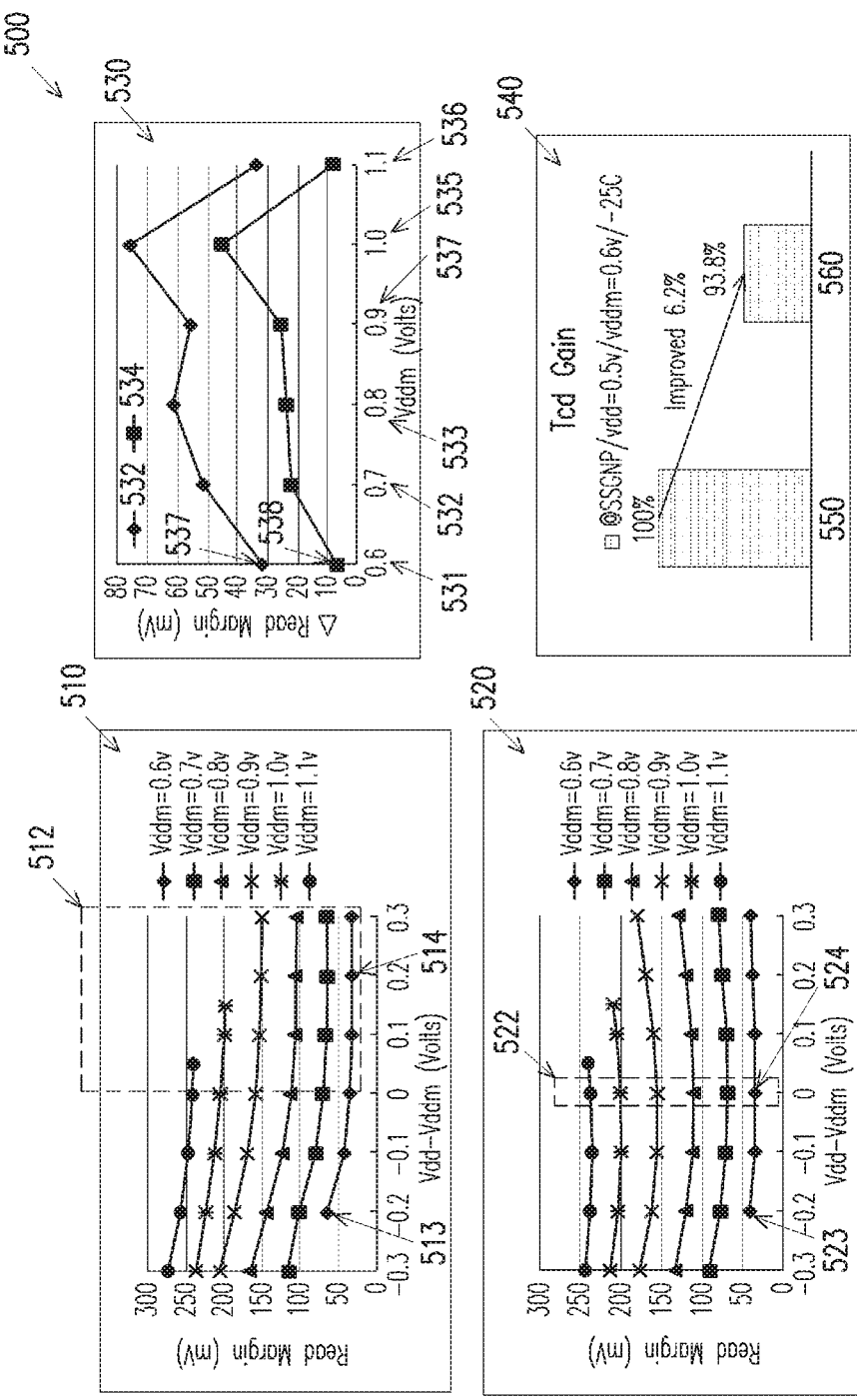
FIG. 5 illustrates improvements obtained in accordance with an embodiment.

FIG. 5 illustrates measured improvements 500 of one embodiment in accordance with the present invention. Chart 510 illustrates GSAE signal read margins employing known techniques. This chart 510 illustrates, for various values of Vddm, how the read margin changes as the difference between Vdd and Vddm changes. In particular, chart 510 illustrates how read margins change as the difference between Vdd and Vddm varies from −0.3 volts to 0.3 volts for six different values of $V_{ddm}$ (0.6 v, 0.7 v, 0.8 v, 0.9 v, 1.0 v, and 1.1 v). As can be seen in the range of $V_{dd}$-$V_{ddm}$ greater than $0^V$ 512, the worst case scenario occurs when $V_{dd} > V_{ddm}$, and continues to get worse as Vddm becomes smaller than Vdd.

Chart 520 provides the same analysis as in chart 510, but measuring the GSAE read margin in a circuit generating a GSAE signal in accordance with the present disclosure. As can be seen, the worst case scenario is shifted to 522 where $V_{dd} = V_{ddm}$, with improved read margins for all measured values for the condition $|V_{dd} - V_{ddm}| > 0$. This is evident in the parabolic shape having Vdd−Vddm=0 as the min. value for each value of Vddm illustrated in chart 520.

Chart 530 compares maximum change in read margins for six values of $V_{ddm}$ (0.6 v, 0.7 v 0.8 v, 0.9 v, 1.0 v, 1.1 v) using previously known methods (the line including circular points 532, including point 537) and using techniques in accordance with this disclosure (the line including square points 534, including point 538). Here, the maximum change in read margin refers to the largest difference between any two measured read margins for a given Vddm (as depicted in charts 510 and 520). Chart 530 plots, for each value of $V_{ddm}$ and for each technique, the maximum change in read margin value as $V_{dd}$ varies over the range $-0.3 < |V_{dd} - V_{ddm}| < 0.3$. Chart 530 shows that for each value of Vddm, the maximum change in read margin using the present techniques, depicted by a line passing through points 534 (including point 538), is less than the maximum change in read margin employing previously known techniques, depicted by a line passing through points 532 (including point 537).

In the illustrated results in chart 530, for each selected value of Vddm (0.6V 531, 0.7V 532, 0.8V 533, 0.9V 537, 1V 535, or 1.1V 536), the maximum change in read margin over a range of Vdd is less using present techniques than using previously known techniques. For example, employing previously known techniques as in Chart 510, the change in read margin for Vddm=0.6V is a difference of about 60 mV occurring at Vdd−Vddm=−0.2V 513. And the change in read margin is about 30 mV occuring at Vdd−Vddm=0.2V 514 as shown in chart 530 at point 537. But, employing the presently disclosed techniques as in chart 520, the maximum change in read margin occurring for Vddm=0.6V is a difference a about 40 mV, occuring at Vdd−Vddm=−0.2V 523, and about 35 mV, ocuring at Vdd−Vddm=0V 524. The overall change in read margin between 523 and 524 then is about 5-6 mV as shown in chart 530 at point 538.

The difference in the maximum change in read margin for previously known techniques and for techniques in accordance with this disclosure are illustrated in chart 530 at Vddm=0.6V 531. The line including circular points 532 corresponds to previously known techniques and is about 30 mV 537. The line including square points 534 corresponds to techniques in accordance with this disclosure and is about 5-6 mV 538. Lastly, chart 540 illustrates that memory applications employing GSAE signals generated in accordance with this embodiment 560 experience a 6.2% improvement over previous techniques 550.

Figure 6:
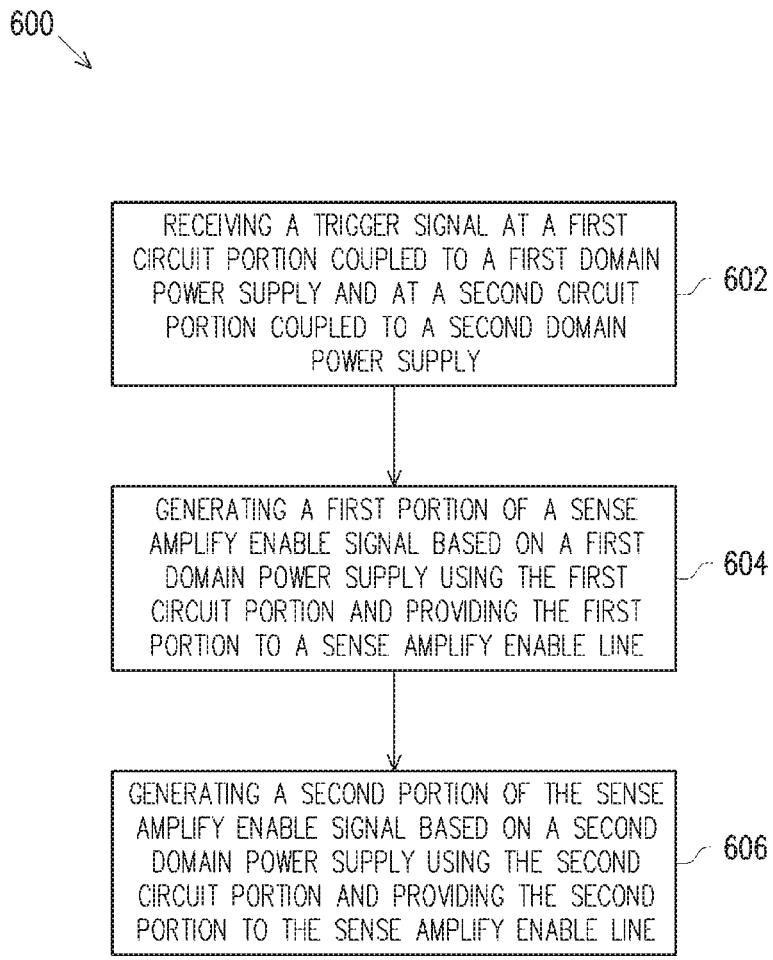
FIG. 6 is a flowchart of a method of generating a sense amplify enable signal in accordance with one or more embodiments.

FIG. 6 depicts an example flow chart of operations 600 for generating a sense amplify enable signal based on voltages supplied from separate and distinct power supply domains. While this process is applicable to countless circuits, the process is described here with reference to aspects of FIGS. 2-4 for ease of understanding. At 602, a trigger signal, e.g. 124, 244, 344, is received at a first circuit portion, e.g. 210, coupled to first domain power supply, e.g. 240, 340, and at a second circuit portion, e.g. 220, coupled to a second domain power supply e.g. 242, 342. Then, at 604 generating a first portion, e.g. 160, 190, of a sense amplify enable signal, e.g. 150, 350 using the first circuit portion, e.g. 210, and providing the first portion, e.g. 160, 190, of the sense amplify signal, e.g. 150, 350 to a sense amplify enable line, e.g. 250, 350. Then, at 606, generating a second portion, e.g. 180, of the sense amplify enable signal, e.g. 150, 350, using the second circuit portion, e.g. 220 and providing the second portion, e.g. 180, to the sense amplify enable line, e.g. 250, 350. In embodiments, the first portion and the second portion may be various components depicted in FIG. 3 as well. For example, the first portion may include Vddm 340, transistors 314a-h, and signals GP 316, node 317, transistor 346, and the various logic gates coupled to these components. The second portion of the circuit may include transistor 348 and signal KPB 322 and logic gates coupled thereto.

The present disclosure provides exemplary methods, circuits and structures for generating a sense amplify enable signal for memory applications. In a read operation, a word-line connected to memory cell blocks is selected causing data stored in individual memory cell blocks to be transferred to a plurality of bit-lines that may be complementary bit-line pairs BL and $BL_{BAR}$, but in other embodiments may be a single bit-line. A sense amplifier is employed to amplify bit-line voltages. A sense line amplifier may be employed during a read or refresh operation. A sense amplifier is enabled by the sense amplifier enable signal, which may be generated in response to a trigger signal such as a bit-line read enable signal. In a memory application, where the memory core may have a different supply (e.g. $V_{ddm}$) than the peripheral (e.g. control, IO) circuitry (e.g. $V_{dd}$), a sense amplifier enable signal that is generated in the peripheral domain experiences significant read margin variations across domain boundaries ($V_{dd}$ to $V_{ddm}$). In this case, the timing clock signal (Tcd) is dominated by the read margin during the worst case scenario ($V_{dd} > V_{ddm}$). In this case, performance of the circuits and in particular various read margins are not optimized for low $V_{dd}$.

To overcome these limitations, a global sense amplify enable (GSAE) signal is generated based on at least two distinct power domains (e.g. $V_{ddm}$ and $V_{dd}$). The front or leading edge of the GSAE takes $V_{ddm}$ while the following edge takes $V_{dd}$. To accomplish this, when a trigger signal is received triggering generation of the GSAE a number of logic gates operate to activate transistors in a sequence. The activated transistors are in different power domains. A first group of gates and transistors operate to place a voltage based on $V_{ddm}$ (memory core supply) onto the sense amplify enable line, then after some delay, the first voltage is de-asserted and the second group of gates and transistors operate to place a second voltage based on $V_{dd}$ (peripheral circuits) onto the GSAE line. The first group may be a $V_{ddm}$ Driver circuit and the second group may be a $V_{dd}$ Keeper circuit. These two circuits may interact with a $V_{max}$ circuit in order to provide the desired voltages to the GSAE line.

The $V_{ddm}$ Driver circuit may include a pull-up network driven by a level shift transistor network. The pull-up network is asserted in response to the trigger signal and works to pull the GSAE circuit up to $V_{ddm}$. The logic gates of the $V_{ddm}$ Driver operate to activate the pull-up network at the appropriate time (e.g. responsive to the trigger signal), and to deactivate the pull-up network after a period of time has passed. The $V_{ddm}$ Driver circuit may also include a pull-down network for pulling the GSAE line low when the GSAE signal is de-asserted, for example when the trigger signal is de-asserted.

The $V_{dd}$ keeper circuit also includes a pull-up network configured to pull the GSAE line up to $V_{dd}$ at the appropriate time. The logic control gates work to activate the $V_{dd}$ Keeper circuit when the $V_{ddm}$ Driver circuit disables the $V_{ddm}$ pull-up network after a period of time has passed. Thus, the two circuits $V_{ddm}$ driver and $V_{dd}$ keeper operate to generate a GSAE signal on the GSAE line by first pulling the GSAE line up to $V_{ddm}$ for a period of time, then by pulling the GSAE line up to $V_{dd}$ for a second period of time, and finally pulling GSAE down to complete the signal. A $V_{max}$ circuit can be employed to place the desired voltages on the GSAE line.

This arrangement for generating a sense amplify enable signal has better power domain tracking between the WL and the GSAE. This provides smaller read margin variations across $V_{dd}$ and $V_{ddm}$. This arrangement also shifts the worst case scenario from $V_{dd}>V_{ddm}$ to $V_{dd}=V_{ddm}$. In at least one application, an embodiment demonstrated a 6.2% improvement in Tcd at speed sign off corner.

In one embodiment, method for generating a sense amplify enable (SAE) signal, or a global sense amplify enable signal (GSAE) on a metal line is disclosed. The method includes receiving a trigger signal at a first circuit portion coupled to a first domain power supply and a second circuit portion coupled to a second domain power supply that is separate and distinct from the first domain power supply. The first circuit portion and the second circuit portion each are further coupled to the metal line. The method also includes generating, for a first period of time, a first portion of the SAE or GSAE signal based on the first domain power supply using the first circuit portion. The method also includes generating, for second period of time, a second portion of the SAE or GSAE signal based on the second domain power supply using a second circuit portion.

In an interrelated embodiment, a circuit is disclosed. The circuit includes a bit-line read enable line; a amplify enable line; a amplify enable signal generation circuit coupled to the amplify enable line. The circuit further includes a first portion coupled to the bit-line read enable line and configured to provide a first voltage based on a first domain power supply to the amplify enable line for a first period of time in response to a voltage variation on the bit-line read enable line, and a second portion coupled to the bit-line read enable line and configured to provide a second voltage based on a second domain power supply to the amplify enable line for a second period immediately following the first period of time.

In an interrelated aspect a semiconductor device is disclose including a first circuit portion comprising at least one first logic gate and a first transistor network coupled to a memory core power supply. The first network is configured to provide a first voltage for a first period responsive to a first control signal provided by the at least one first logic gate. The control signal is based on a peripheral power supply. A second circuit portion has at least one second logic gate and a second transistor network coupled to the peripheral power supply. The second network is configured to provide a second voltage for a second period following the first period responsive to a second control signal provided by the at least one second logic gate. A maximum voltage circuit is coupled to the first transistor network, the second transistor network, and a metal line. The maximum voltage circuit is configured to provide the first voltage and the second voltage to the metal line to form a signal comprising the first voltage on the leading edge followed by the second voltage on a trailing edge.

In another interrelated aspect, a circuit comprises a means for generating a signal having a leading edge based on a first domain power supply and a trailing edge based on a second domain power supply. The second domain power supply is separate and distinct from the first domain power supply The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for generating a sense amplify enable (SAE) signal on a SAE line, comprising:
   receiving a trigger signal at a first circuit portion coupled to a first domain power supply and a second circuit portion coupled to a second domain power supply that is separate and distinct from the first domain power supply, the first circuit portion and the second circuit portion each further coupled to the SAE line for carrying the SAE signal;
   generating, for a first period of time, a first portion of the SAE signal based on the first domain power supply using the first circuit portion;
   generating, for second period of time, a second portion of the SAE signal based on the second domain power supply using a second circuit portion; and
   activating the second circuit portion to generate the second portion of the SAE signal in response to deactivating the first circuit portion to cease generating the first portion.

2. The method of claim 1, further comprising:
   generating the trigger signal based on the second domain power supply in association with a read or write operation in the memory cell array;
   generating, responsive to receiving the trigger signal, a delayed signal based on the second domain power supply; and
   applying the first portion of the SAE signal to the SAE line; and responsive to the delayed signal, applying the second portion of the SAE signal to the SAE line.

3. The method of claim 2, wherein generating the first portion of the SAE signal is responsive to applying the trigger signal to a first logic gate coupled to a first transistor network coupled to the first domain power supply, and further wherein generating the second portion of the SAE signal is responsive to applying the delayed signal to a second logic gate coupled to a second transistor network coupled to the second power supply domain such that the second period of time immediately follows the first period of time.

4. The method of claim 1, further comprising:
applying the SAE signal to a sense amplifier coupled to a bit-line; and
generating, by the peripheral circuitry, a word-line signal for activating a row of memory cells within the memory cell array during the read or write operation, the word-line signal based on the first domain power supply, wherein the bit-line carries data responsive to the word-line activating a memory cell of the row of memory cells during the read or write operation.

5. The method of claim 1, further comprising:
supplying power to a word-line based on the first domain power supply supplying power to a memory core with the first domain power supply; and
supplying power to a peripheral circuit with the second domain power supply.

6. The method of claim 1, further comprising:
generating the first portion of the SAE signal using a voltage maximum circuit configured to supply a voltage to a SAE signal line based on a greater voltage of a first voltage provided by the first circuit or a second voltage provided by the second circuit.

7. The method of claim 1, further comprising:
supplying the trigger signal to at least one logic gate;
deactivating the first circuit portion to cease generating the first portion after a first period in part defined by a gate delay associated with the at least one logic gate.

8. The method of claim 1, further comprising:
responsive to receiving the trigger signal, generating:
 a pull-up signal for activating a pull-up network, and
 a pull-down signal for activating a pull-down network, wherein the first portion of the SAE signal is generated at a node formed by coupling the pull-up network to the pull-down network.

9. A circuit comprising:
a bit-line read enable line;
a sense amplify enable (SAE) line;
a SAE generation circuit coupled to the sense amplify enable line, comprising:
 a first portion coupled to the bit-line read enable line and configured to provide a first voltage based on a first domain power supply to the SAE line for a first period of time in response to a voltage variation on the bit-line read enable line; and
 a second portion coupled to the bit-line read enable line and configured to provide a second voltage based on a second domain power supply to the SAE line for a second period immediately following the first period of time, wherein the second portion is activated to provide the second voltage for the second period in response to the first portion being deactivated to cease providing the first voltage.

10. The circuit of claim 9, wherein the first domain power supply is a memory core power supply.

11. The circuit of claim 9, wherein the first domain power supply also supplies power to a SRAM and the first voltage is +/−5% of a SRAM voltage supplied to the SRAM, and further wherein the second domain power supply also supplies a peripheral circuit and the second voltage is +/−5% of a peripheral voltage supplied to the peripheral circuit.

12. The circuit of claim 9, wherein the SAE line carries an SAE signal comprising the first voltage at a front edge of the SAE signal and the second voltage immediately following the first voltage.

13. The circuit of claim 9, wherein the SAE generation circuit further comprises:
one or more delay gates that define a propagation delay by propagating a signal responsive to the voltage variations on the bit-line read enable line, the propagation delay further defining the first period.

14. The circuit of claim 9, wherein the SAE generation circuit further comprises a logic gate network that is configured to turn on the second portion substantially simultaneously to disabling the first portion.

15. The circuit of claim 9, wherein the SAE generation circuit further comprises a logic gate; and a voltage maximum circuit for providing the first voltage and the second voltage to the SAE line, the voltage maximum circuit comprising transistors having a threshold voltage smaller than an intrinsic threshold voltage of the logic gate.

16. The circuit of claim 9, wherein the first portion of the SAE generation circuit comprises a pull-up network and a pull-down network, wherein the pull-up network provides the first voltage and wherein the pull-down network is configured to pull the SAE line down, and further wherein the pull-up network and the pull-down network are each asserted complementarily offset by a delay.

17. A semiconductor device comprising:
a first circuit portion comprising at least one first logic gate and a first transistor network coupled to a memory core power supply, the first transistor network configured to provide a first voltage for a first period responsive to a first control signal provided by the at least one first logic gate, the first control signal based on a peripheral power supply;
a second circuit portion comprising at least one second logic gate and a second transistor network coupled to the peripheral power supply, the second transistor network configured to provide a second voltage for a second period following the first period responsive to a second control signal provided by the at least one second logic gate; and
a maximum voltage circuit coupled to the first transistor network, the second transistor network, and a metal line, the maximum voltage circuit configured to provide the first voltage and the second voltage to the metal line to form a signal comprising the first voltage on a leading edge followed by the second voltage on a trailing edge.

18. The semiconductor device of claim 17, further comprising a third circuit portion comprising at least one third logic gate for controlling a third network coupled to the metal line and configured to pull the metal line low responsive to a complement of the first control signal.

19. The semiconductor device of claim 18, wherein the at least one first logic gate and the at least one third logic gate are separate and distinct from each other.

20. The semiconductor device of claim 17, wherein the maximum voltage circuit comprises transistors having a threshold voltage smaller than an intrinsic threshold voltage of one of the at least one first logic gate or the at least one second logic gate.

* * * * *